(12) United States Patent
Sun

(10) Patent No.: US 7,363,423 B2
(45) Date of Patent: Apr. 22, 2008

(54) MULTIPLE MATCH DETECTION CIRCUIT

(75) Inventor: Dechang Sun, Chanhassen, MN (US)

(73) Assignee: LSI Logic Corporation, Milpitas, CA (US)

( * ) Notice: Subject to any disclaimer, the term of this patent is extended or adjusted under 35 U.S.C. 154(b) by 458 days.

(21) Appl. No.: 10/909,632

(22) Filed: Aug. 2, 2004

(65) Prior Publication Data

US 2006/0023481 A1 Feb. 2, 2006

(51) Int. Cl.
*G11C 15/00* (2006.01)

(52) U.S. Cl. .................. 711/108; 711/100; 711/101; 365/49; 365/50; 365/189.01; 365/189.07; 365/189.08

(58) Field of Classification Search ............. 711/108, 711/100, 101; 365/49, 50, 189.01, 189.07, 365/189.08
See application file for complete search history.

(56) References Cited

U.S. PATENT DOCUMENTS

| 6,924,994 | B1 * | 8/2005 | Lin et al. ............... | 365/49 |
| 6,947,302 | B2 * | 9/2005 | Regev .................. | 365/49 |
| 2002/0078110 | A1 | 6/2002 | Rumynin et al. ........ | 708/210 |
| 2003/0145178 | A1 * | 7/2003 | Jiang et al. ........... | 711/158 |
| 2004/0130924 | A1 * | 7/2004 | Ma et al. .............. | 365/49 |
| 2004/0170042 | A1 * | 9/2004 | Regev ................. | 365/49 |

OTHER PUBLICATIONS

Abd-Elfattah Abd-Alla & Arnold Meltzer, "Principles of Digital Computer Design", Prentice-Hall, Inc., Englewood Cliffs, New Jersey, 1976, p. 97, "Section 5.1—Switching Algebra", 5.1.1 Basic Operations.*
Partial translation of M.I. Grinchuk, "O Monotonnoi Slozhnosti Porogovykh Funktsii" (On Monotone Complexity of threshold Functions), Metody Diskretnogo Analiza v Teorii Grafov I Slozhnosti (Methods of Discrete Analysis in Graph and Complexity Theories), Novosibirsk, Siberian branch of Russian Acad. Sci., vol. 52, pp. 41-48 (1992).
John E. Savage, "The Complexity of Computing," John Wiley & Sons, Inc., A Wiley-Interscience Publication, 1976, Ch. 3, pp. 69, 130-131.

* cited by examiner

*Primary Examiner*—Stephen C. Elmore
*Assistant Examiner*—Daniel Kim
(74) *Attorney, Agent, or Firm*—Westman, Champlin & Kel

(57) ABSTRACT

Multiple matches of words in a content addressable memory are detected by identifying each match of the input word to a word in the memory, and generating a representation of a relationship OR ($x_i$ AND $x_j$), where $x_i = x_1, x_2, \ldots x_{N-1}$, $x_j \in x_{i+1}, x_{i+2}, \ldots x_N$, and $x_1, x_2, \ldots, x_N$ are the compare results of the individual words in the memory to the input word. A representation of at least one match is identified by generating a representation of a relationship $x_1$ OR $x_2$ OR $x_3$ OR ... OR $x_N$. The apparatus comprises a hierarchy of logic that carries a general match representation indicating at least one match between the input word and all of the memory words, and a multiple-match representation indicating multiple matches between the input word and the words in the memory.

16 Claims, 4 Drawing Sheets

MULTIPLE MATCH DETECTION CIRCUIT

FIELD OF THE INVENTION

This invention pertains to multiple match detection circuits for use with content addressable memories.

BACKGROUND OF THE INVENTION

Content addressable memories (CAM) are used to compare input words to all words stored in the memory. If the input word matches one or more words stored in the memory, the CAM will output the address of one of the matched words. In some CAM applications, it is important to know if a "match" result is a single-hit or multiple-hit. For this, a multiple match detect circuit must be used with such CAMs.

Prior multiple match detect circuits included dynamic analog comparator circuits that measured a signal value that was based on the number of hits. The worst-case condition of such circuits was to distinguish between one and two hits, since the difference between those two cases was the smallest.

As semiconductor technology advances toward smaller transistors, process variations of manufacturing semiconductor chips affects transistor performance in relatively greater proportion. In $0.13\mu$ and newer integrated circuit technologies, the effects of process variation is relatively large compared to older, larger technologies. Therefore, it is more difficult to distinguish between one and two hits with an analog comparator with newer, smaller technologies. One problem of analog comparator circuits is that they do not consistently operate across all PVT corners (i.e. different combinations of process, voltage and temperatures). For example, inconsistency is known to exist in chips constructed using $0.18\mu$ technology. The ability to form reliable analog comparators in $0.13\mu$ and newer technology is even more problematic due to the sensitivity of the chip to process variations.

FIG. 1 illustrates a prior multiple match detect circuit for a CAM containing N words and constructed in $0.18\mu$ or larger technology. Individual hitlines HL0-HL[N-1] carry the compare results of individual words in the CAM to the input word; the hitline carrying a signal representing that the corresponding word in the CAM matches the input word. Hitlines HL0-HL[N-1] are connected to two dedicated bitlines, X1N and X1 through respective pull-down transistors 10 and respective pull-up transistors 12. When a hit signal appears on any of the hitlines HL0-HL[N-1], the respective pull-down and pull-up transistors will be turned on. Thus if one hit occurs, one pull-down and one pull-up transistors are turned on; if there are two hits, two pull-down and two pull-up transistors will be turned on, and so on. Bitlines X1N and X1 are connected to analog comparator 14, which distinguishes between one and two hits according to different pull-up and pull-down strengths.

One problem with prior analog multiple match detect circuits is that as the technology moves to smaller transistors, such as $0.18\mu$ and smaller, it becomes difficult to find a working point for the comparator to distinguish one and two hits across all PVT corners. The circuit would be too sensitive to process variations that the confidence is not great that multiple hits in a CAM would be detected using $0.13\mu$ technology.

Another disadvantage with some multiple hit detection circuits is that they are not designed to identify multiple hits simultaneously with the identification of general hits, an identification of a general hit being that there is at least one hit in alliwords of the memory. More particularly, all CAMs are designed to identify general hits, but separate circuitry is required to identify multiple hits.

Yet another disadvantage with analog comparator circuits used for multiple match detection is that the comparator circuit must operate on a clock signal, which causes timing or race condition issues that must be addressed with timing margins. The addition of timing margins usually slows circuit performance, thereby contributing to delay.

SUMMARY OF THE INVENTION

The present invention is directed to a logical multiple match detection circuit that identifies single and multiple matches of an input word to words in a content addressable memory.

In one embodiment, multiple matches of words in a content addressable memory are detected by identifying each match of the input word to a word in the memory, and generating a representation of a relationship $OR(x_i \text{ AND } x_j)$, where $x_i = x_1, x_2, \ldots x_{N-1}$, $x_j \in x_{i+1}, x_{i+2}, \ldots x_N$, and $x_1, x_2, \ldots, x_N$ are the compare results of individual words in the memory to the input word.

In some versions, a representation of at least one match is identified by generating a representation of a relationship $x_1$ OR $x_2$ OR $x_3$ OR $\ldots$ OR $x_N$.

In another embodiment, a circuit detects multiple matches of words in a content addressable memory to an input word. The content addressable memory has a hitline for each word in the memory, each hitline carrying a binary signal representative of a match or not-match condition of the respective word to the input word. A first logic element is responsive to binary signals representative of a match condition on respective pairs of hitlines to propagate a multiple-match signal. A second logic element is responsive to binary signals representative of a match condition on each hitline to propagate respective hit signals. A third logic element is responsive to a plurality of hit signals propagated by the second logic element to propagate the multiple-match signal.

In some versions the logic elements are arranged in a hierarchical arrangement such that the first logic element comprises a plurality of first logic gates coupled to respective pairs of hitlines. The second logic element comprises a plurality of second logic gates coupled to the respective pairs of hitlines. The third logic element comprises a plurality of third logic gates responsive to hit signals propagated by respective pairs of second logic gates to propagate respective match signals.

DETAILED DESCRIPTION OF THE PREFERRED EMBODIMENTS

The present invention is directed to a multiple match detection circuit for a CAM that uses static logic, rather than dynamic analog comparators. Consequently, the multiple match detection circuit of the present invention is physically more reliable and less sensitive to process variations than other dynamic versions of multiple match detection circuit.

The multiple match detection is realized in a hierarchical manner. At a first logic level, herein referred to as the X2 level, "hit" and "multiple hit" signals, H2 and M2, respectively, are generated for each pair of words ($W_0$ and $W_1$, $W_2$ and $W_3$, . . . ). A hit signal indicates whether or not there is at least one match between the two words and a multiple hit signal indicates whether or not both words matched. Thus, H2=HL0 OR HL1 and M2=HL0 AND HL1, where HL0 and HL1 are the hitline signals from words 0 and 1.

Figure 1:
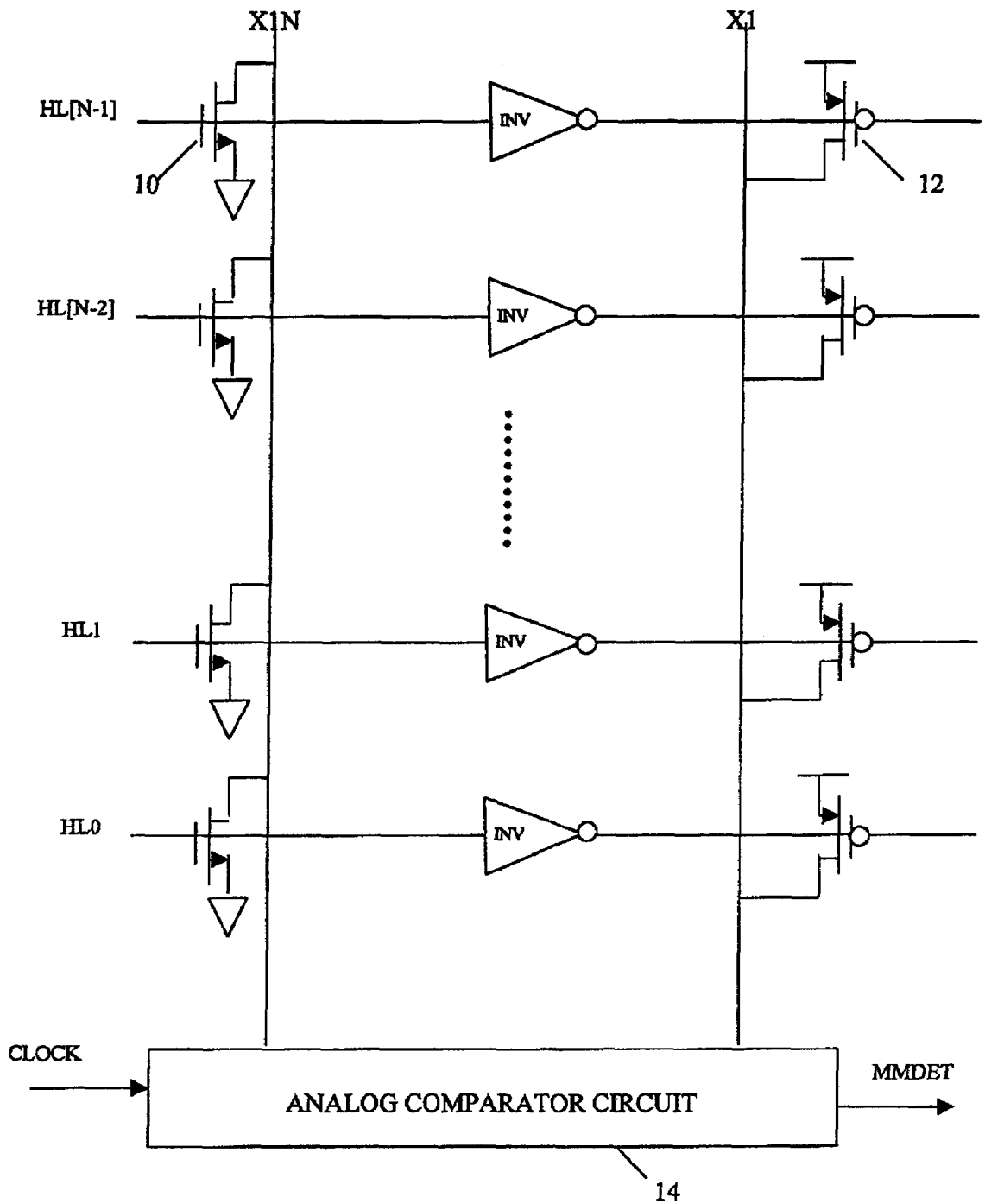
FIG. 1 is a circuit diagram of a prior multiple match detection circuit.
Figure 2:
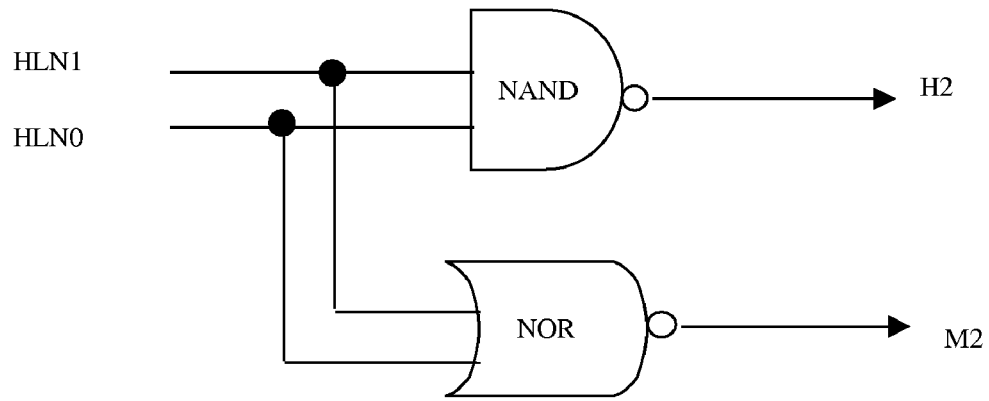
FIGS. 2-7 are circuit diagrams of various embodiments of multiple match detection circuits according to the present invention.

Signals H2 and M2 can be generated using one NAND and one NOR gate, as shown in FIG. 2, where HLN0 and HLN1 are the inversions of HL0 and HL1, respectively. If at least one of HLN0 and HNL1 is low (meaning that one or both of HL0 and HL1 is high), the NAND gate propagates a high H2 signal indicating a "hit" amongst HL0 and HL1. If both of HLN0 and HNL1 are low (meaning that both HL0 and HL1 are high), the NOR gate propagates a high M2 signal indicating a "multiple hit" with HL0 and HL1.

Figure 3:
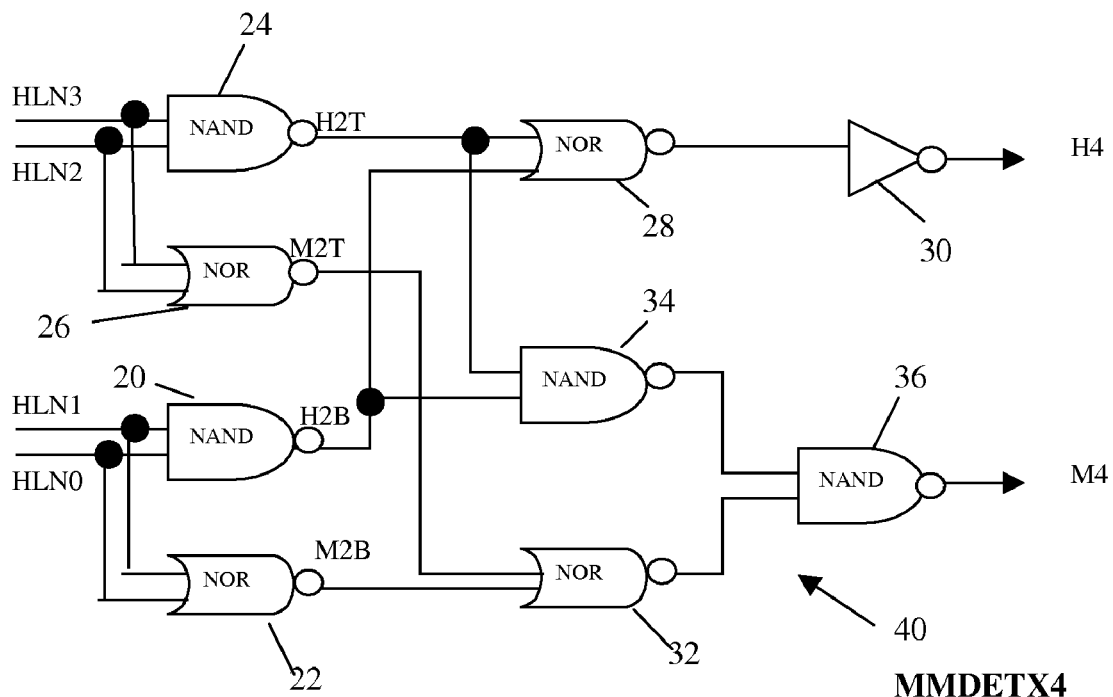

At a second logic level for each four words, herein referred to as the X4 level, hit and multiple hit signals (H4 and M4) are generated using the hit and multiple hit signals from the X2 level (H2T/M2T for the top pair and H2B/M2B for the bottom pair), H4=H2T OR H2B, M4=(H2T AND H2B) OR (M2T OR M2B). FIG. 3 shows the circuit for realizing H4 and M4.

As shown in FIG. 3, the MMDETX4 circuit 40 includes NAND gate 20 and NOR gate 22 connected to receive the HLN0 and HLN1 and configured as shown in FIG. 2 to propagate H2 and M2 signals, designated H2B and M2B. Similarly, NAND gate 24 and NOR gate 26 receive the HLN3 and HLN4 and are configured to propagate H2T and M2T signals. NOR gate 28 receives the H2B and H2T signals and propagates an inversion of the H4 signal. Thus, if either H2B or H2T is high, indicating a "hit" amongst the inputs, NOR gate 28 propagates a low signal, which is inverted by inverter 30 to provide a high H4 signal, indicating at least one hit.

NOR gate 32 receives the M2B and M2T signals. If either M2B or M2T is high (meaning a multiple hit amongst HL0 and HL1 or HL2 and HL3), gate 32 propagates a low signal to NAND gate 36. NAND gate 34 receives the H2B and H2T signals and will propagate a logical low if both of H2B and H2T are high (meaning at least one of HL0 and HL1 is a match and at least one of HL2 and HL3 is a match, so there are at least two matches in HL0-HL03). NAND gate 36 receives the outputs of gates 32 and 34 and propagates a high to the M4 output if either (or both) inputs is low (indicating a multiple hit amongst HL0-HL3).

Figure 4:
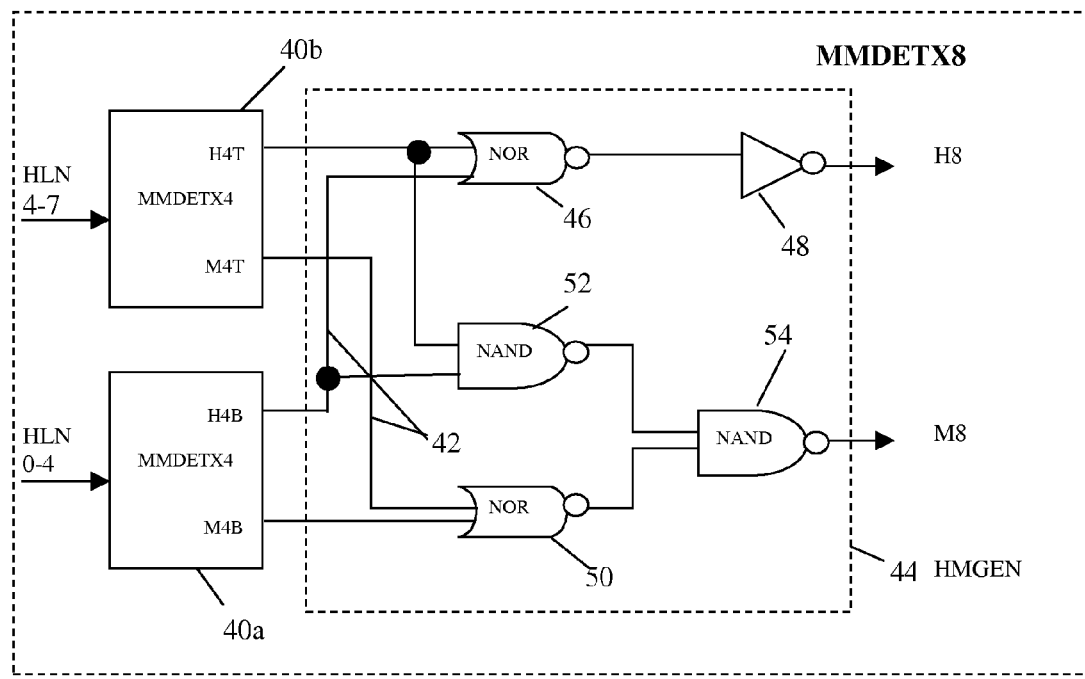

FIG. 4 is a circuit diagram of a multiple hit detection circuit for the X8 level. Circuit MMDETX8 includes two MMDETX4 circuits 40a and 40b, illustrated in FIG. 3, receiving HNL0-HNL3 and HNL4-HNL7 signals, respectively. An HMGEN circuit 44 is connected to the outputs of circuits 40a and 40b and includes a NOR gate 46 and inverter 48 that propagate the H8 hit signal, and NOR gate 50 and NAND gates 52 and 54 that propagate the M8 multiple hit signal. It will be appreciated that NOR gate 46 and inverter 48 operate in a manner similar to gate 28 and inverter 30 in FIG. 3 and that NOR gate 50 and NAND gates 52 and 54 operate in a manner similar to gates 32-36 in FIG. 3.

Figure 5:
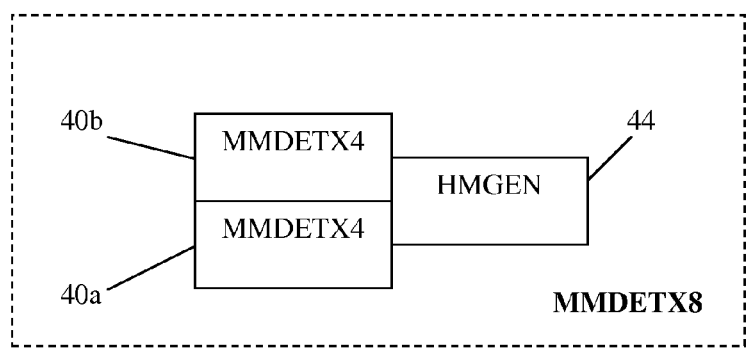
Figure 6:
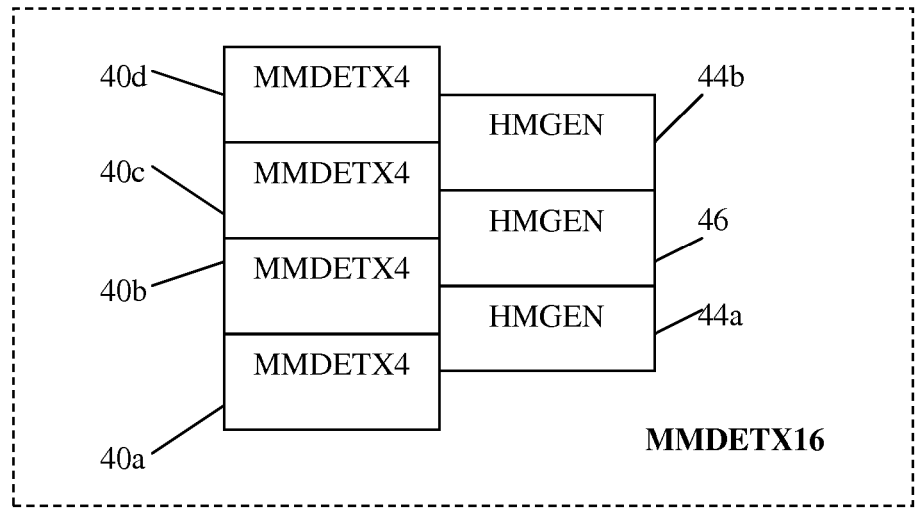
Figure 7:
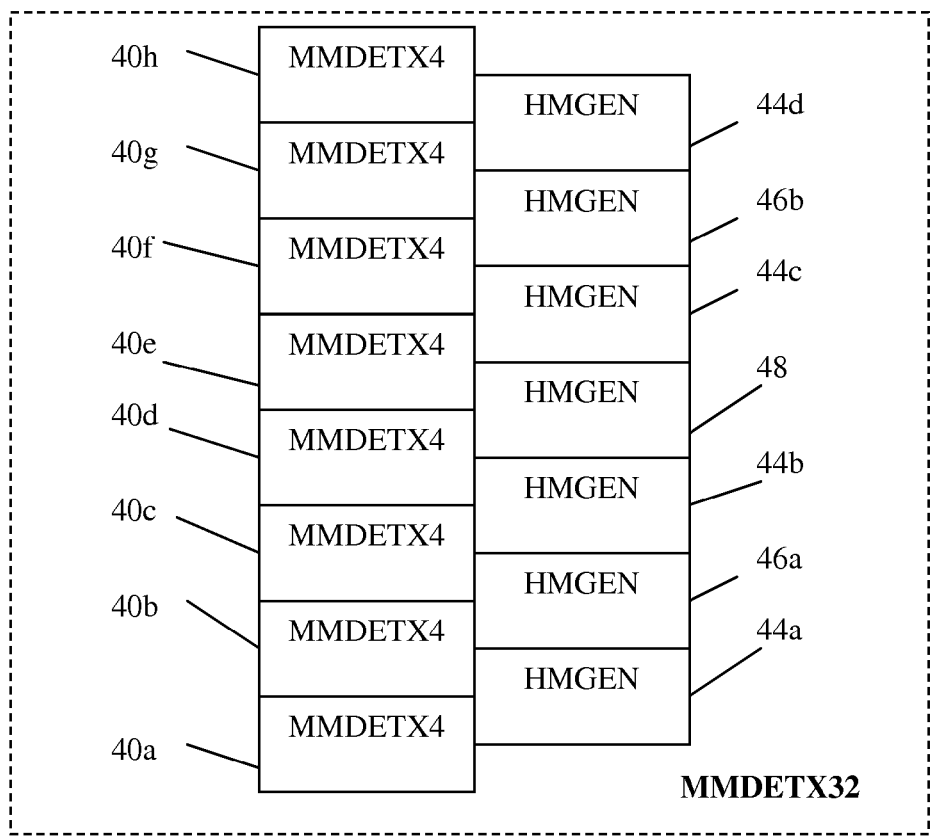

Similarly, the hit and multiple hit signals can be generated at X16, X32, . . . , X256 levels, etc. by simple expansion of the circuit. As shown in FIGS. 5-7 each level of circuit employs two instances of the next smaller circuit plus an additional HMGEN circuit 44 shown in FIG. 4.

FIGS. 5-7 illustrate layouts for the MMDETX8 circuit shown in FIG. 4, an MMDETX16 and an MMDETX32 circuit. As shown in FIG. 5, the MMDETX8 circuit is composed of one HMGEN circuit 44 in a second column connected to two MMDETX4 circuits 40a and 40b in a first column. For the MMDETX16 circuit shown in FIG. 6, the layout consists of four MMDETX4 circuits 40a-40d and two HMGEN circuits 44a and 44b configured as two MMDET8 circuits, plus one additional HMGEN circuit 46, as shown in FIG. 6. Circuit 46 is identical to HMGEN circuit 44. For an MMDETX32 circuit, the layout consists of eight MMDETX4 circuits 40a-40h and six HMGEN circuits 44a-44b and 46a and 46b configured as two MMDET16 circuits, plus one additional HMGEN circuit 48, as shown in FIG. 7. It is evident that the circuit can be expanded to accommodate content addressable memories capable of storing N words, where $N=2^x$ and x is a whole natural number.

From the above, it is evident that for a CAM containing N words, the hit signal $$H(x_1, \ldots, x_N)=x_1 \text{ OR } x_2 \text{ OR } x_3 \text{ OR } \ldots \text{ OR } x_N, \quad (1)$$

and the multiple-match signal $$M(x_1, \ldots, x_N)=\text{OR}(x_i \text{ AND } x_j), \quad (2)$$

where $x_1, x_2, \ldots, x_N$ are the individual words in the CAM, $x_i=x_1, x_2, \ldots x_{N-1}$ and $x_j \epsilon x_{i+1}, x_{i+2}, \ldots x_N$. Thus, if any $x_i$ and any $x_j$ are both true, a multiple match is detected by relationship (2). A general match is identified if at least one input is true in expression (1) even though no multiple-match is found by expression (2).

The physical layouts shown in FIGS. 5-7 illustrate that all MMDETX4 circuits 40 are placed in a first column of the chip and all HMGEN circuits 44, 46, 48 are placed in a second column of the chip, regardless of the size of the CAM or the multiple match detection circuit. As shown in FIG. 4, routing wires 42 will be necessary for each HMGEN circuit 44 and 46 to couple the outputs of circuits 40 to circuits 44, from circuits 44 to circuits 46, and so on. Vertical routing wires are also necessary in at least some circuits 44, 46, etc. to serve as routes for connecting circuits 46 to circuits 48, etc. In X2, X4 and X8 levels, the routings are preferably done locally, since the transistors are close to each other. Vertical long distance routing wires are necessary at the X16 level and above to connect the output of one level to the inputs of the next higher level. For a memory containing 256 words, about ten such vertical routing wires are necessary. Consequently, it is more convenient to standardize the HMGEN circuit as a single standard cell with adequate routing wires for any necessary purpose.

In some embodiments, the gate sizes are smaller in the MMDETX4 circuits than in the HMGEN circuits at the MMDETX8 level and above. More particularly, the signal nets of the MMDETX4 level are physically close to each other and the parasitic metal capacitance/resistance is relatively small. Consequently, a small driver is adequate to propagate the hit and multiple hit signals through the MMDETX4 level. Theoretically, the higher the level, the larger the driver size that is required to propagate the signals. But from layout consideration, it is better to make all HNGEN circuits the same size. In preferred embodiments the circuit is constructed as part of an integrated circuit chip in a technology not greater than 0.18μ, and preferably using 0.13μ technology.

With reference to FIG. 3, NAND gates 20, 24 and 34 of the MMDETX4 circuits 40 have PMOS/NMOS widths of 1.0μ/1.0μ, NAND gate 36 has a PMOS/NMOS width of 2.0μ/2.0μ, NOR gates 22, 26, 28 and 32 have PMOS/NMOS widths of 2.0μ/0.5μ, and inverter 30 has a PMOS/NMOS width of 2.0μ/1.0μ. For the HMGEN cell (FIG. 4) each NOR gate has a PMOS/NMOS width of 8.0μ/2.0μ, NAND gate 52 has a PMOS/NMOS width of 4.0μ/4.0μ, NAND gate 54 has a PMOS/NMOS width of 8.0μ/8.0μ, and inverter 48 has a PMOS/NMOS width of 8.0μ/4.0μ.

From the circuits of FIGS. 2-4, it is evident that each logic level generates an M output signal as well as an H signal. Consequently, the hit signal H and the multiple-hit signal M are generated simultaneously at each level.

The layout of the multiple match detection circuit starts with a plurality of MMDETX4 cells, each having a height of four rows, each of the four inputs to each MMDETX4 cell being connected to a respective hitline of the CAM. Thus, there are at least N/4 MDMETX4 cells. If N is not a number which is evenly divisible by 4, then the number of MMDETX4 cells considered is equal to the next number that is greater than N and evenly divisible by 4. HMGEN cells (shown in FIG. 4) are built to a height of 4 rows and placed in the second column (as shown in FIGS. 5-7). Respective HMGEN cells are connected to two respective MMDETX4 cells (in the first column) or to two respective HMGEN cells (in the second column). Only two columns of circuit are necessary.

One feature of the invention is that only two basic circuits are necessary to form a multiple hit detection circuit, namely the MMDETX4 cell 40 and the HMGEN cell 44. Expansion of the circuit to accommodate the capacity of the CAM is accomplished by coupling plural copies of cells 40 and 44, with local and/or vertical routing wires, as herein described.

If the number of words N is not equal to some whole number power of 2, the circuit is designed using a number of words equal to N+M, where M is the lowest number of words beyond the capacity (N) of the CAM such that $N+M=2^x$ and x is a whole natural number. The cells dedicated exclusively to the M words may be eliminated, and the inputs of cells dedicated exclusively to the M words may be defaulted to a not hit value.

A multiple match detection circuit according to the present invention for a CAM containing 256 words in 0.13μ technology will not create significant RC delays. The critical path of the 256-word MMDET circuit is 15 NAND, NOR and/or inverter gates (three gates for the MMDETX4 gate and two gates for each of the six logic levels of HMGEN gates). The delay is actually smaller than some dynamic analog multiple match detection circuits.

The present multiple match detection circuit is physically robust and less sensitive to process variations due to the static logic employed. There are no timing issues because the circuit uses no clock signals. Analog detection circuits required all input signals to be present before the comparator can be enabled by the clock signal, thereby adding to the delay of analog circuits; the present multiple match detection circuit does not employ a clock so logical functions are generated as soon as the inputs permit. Nor are there charge-sharing problems as in some analog circuits.

The present invention is particularly useful for content addressable memories requiring multiple match detection.

Although the present invention has been described with reference to preferred embodiments, workers skilled in the art will recognize that changes may be made in form and detail without departing from the spirit and scope of the invention.

What is claimed is:

1. A process of detecting multiple matches of words in a content addressable memory to an input word comprising steps of:
   a) receiving binary compare results, $x_1, x_2, \ldots, x_N$, from the memory representative of a match or not match condition of the input word to a respective word in the memory, and
   b) generating a representation of a relationship of $x_i$ and $x_j$ with static logic, where $x_i = x_1, x_2, \ldots x_{N-1}$ and $x_j \in x_{i+1}, x_{i+2}, \ldots x_N$, and wherein if any pair of $x_i, x_j$ are both true, the relationship is true, and wherein generating comprises:
      propagating a plurality of first-level general match representations though a plurality of first logic gates, each coupled to respective pairs of the binary compare results in response to a match condition on at least one of the binary compare results;
      propagating a plurality of first-level multiple-match representations though a plurality of second logic gates, each coupled to the respective pairs of the binary compare results in response to a match condition on at least two binary compare results;
      propagating at least two of the first-level general match representations through at least one third logic gate coupled to at least two of the first logic gates to generate at least one second-level general match representation; and
      propagating at least two of the first-level general match representations through at least one fourth logic gate coupled to at least two of the first logic gates to generate a first second-level multiple match representation.

2. The process of claim 1, further comprising a step of:
   c) generating a representation of a relationship $x_1$ OR $x_2$ OR $x_3$ OR . . . OR $x_N$.

3. The process of claim 2, wherein steps (b) and (c) are executed simultaneously.

4. The process of claim 1, wherein the content addressable memory has a hitline for each word in the memory, each hitline carrying a respective compare result and the hitlines are arranged in pairs, and step (b) comprises a step of:
   coupling each of the first logic gates to a respective pair of the hitlines;
   coupling each of the second logic gates to respective pairs of the hitlines; and
   generating the at least one second-level general match representation if at least one of the first-level general match representations indicate a match condition on the respective pair of hitlines.

5. The process of claim 4, further comprising steps of:
   generating the first, second-level multiple match representation if at least two of the first-level general match representations indicate a match condition on the respective pairs of hitlines.

6. The process of claim 1 wherein the step of generating further comprises:
   propagating at least two of the first-level multiple match representations though at least one fifth logic gate coupled to at least two of the second logic gates to generate a second, second-level multiple-match representation; and
   propagating the first and second, second-level multiple match representations through at least one sixth logic gate coupled to the respective fourth and fifth logic gates to generate a further multiple-match representation.

7. The process of claim 6, and further comprising:
generating the second, second-level multiple-match representation if at least one of the first-level multiple match representations indicate a multiple match condition; and
generating the further multiple-match condition if at least one of the first and second, second-level multiple match representations indicate a multiple match condition.

8. Apparatus for detecting multiple matches of words in a content addressable memory to an input word, the content addressable memory having a hitline for each word in the memory, each hitline carrying a binary compare result representative of a match or not-match condition of the respective word in the memory to the input word, the apparatus comprising:
first static logic responsive to the binary signals on the hitlines to generate a multiple-match representation based on a relationship of $x_i$ and $x_j$ where $x_i = x_1, x_2, \ldots, x_{N-1}$, $x_j \in x_{i+1}, x_{i+2}, \ldots, x_N$, and $x_1, x_2, x_3, \ldots, x_N$ are compare results of the individual words in the memory to the input word, and wherein if any pair of $x_i, x_j$ are both true, the relationship is true;
second static logic responsive to the binary compare results on the hitlines to generate a general match representation based on a relationship $x_1$ OR $x_2$ OR $x_3$ OR . . . OR $x_N$;
the second static logic comprising:
a plurality of first logic gates coupled to respective pairs of hitlines; and
a third logic gate coupled to at least two first logic gates to propagate the general match representation;
the first static logic comprising:
a plurality of second logic gates coupled to the respective pairs of hitlines; and
a fourth logic gate responsive to the general match representation propagated by a respective pair of first logic gates to propagate a respective first multiple-match representation.

9. The apparatus of claim 8, the first static logic further comprising: a fifth logic gate coupled to at least two respective second logic gates to propagate a respective second multiple-match representation, and
at least one sixth logic gate coupled to the fourth logic gate and the fifth logic gate to generate a further multiple-match signal.

10. The apparatus of claim 9, embodied in an integrated circuit chip, and further comprising a first level circuit comprising at least two sets of the first and second static logic and a second level circuit, which propagates the general match representations and the further multiple match representations generated by the sets of the first and second static logic in the first level wherein, the logic gates in the first logic level are smaller than logic gates in the at least one second logic level.

11. The apparatus of claim 9, wherein the apparatus is embodied in an integrated circuit chip constructed in technology not greater than 0.18μ.

12. Apparatus for detecting multiple matches of words in a content addressable memory to an input word, the content addressable memory having a hitline for each word in the memory, each hitline carrying a binary compare result representative of a match or not-match condition of the respective word in the memory to the input word, the apparatus comprising a hierarchy of logic elements arranged in a plurality of logic levels comprising:
a first logic level comprising:
a plurality of first logic gates coupled to respective pairs of hitlines and responsive to a match condition on at least one hitline to propagate a general match representation, and
a plurality of second logic gates coupled to the respective pairs of hitlines and responsive to a match condition on at least two hitlines to propagate a first multiple-match representation; and
at least one second logic level comprising:
at least one third logic gate coupled to a respective pair of first logic gates to propagate the general match representation,
at least one fourth logic gate coupled to the respective pair of first logic gates and responsive to a general match representation propagated by a pair of first logic gates to propagate a second multiple-match representation,
at least one fifth logic gate coupled to a respective pair of second logic gates to propagate the first multiple-match representation, and
at least one sixth logic gate coupled to the respective fourth and fifth logic gates to propagate the multiple-match representation.

13. The apparatus of claim 12, wherein there are a plurality of hierarchically arranged second logic levels, and the third logic gates of successive second logic levels are coupled together to propagate the general match representation.

14. The apparatus of claim 13, wherein the fourth logic gates of successive second logic levels are coupled to the third and sixth logic gates of differently paired gates in the prior second logic level to propagate the first multiple-match representation and the fifth logic gates of successive second logic levels are coupled to differently paired sixth logic gates in the prior second logic level to propagate the second multiple-match representation.

15. The apparatus of claim 12, embodied in an integrated circuit chip, and the logic gates in the first logic level are smaller than the logic gates in the at least one second logic level.

16. The apparatus of claim 15, wherein the integrated circuit chip is constructed in technology not greater than 0.18μ.

* * * * *